United States Patent [19]

Fickes

[11] 4,397,941

[45] Aug. 9, 1983

[54] DRY NONELECTROSCOPIC TONERS FOR TONING TACKY IMAGE SURFACES

[75] Inventor: Michael G. Fickes, Matawan, N.J.

[73] Assignee: E. I. Du Pont de Nemours and Company, Wilmington, Del.

[21] Appl. No.: 335,509

[22] Filed: Dec. 29, 1981

Related U.S. Application Data

[62] Division of Ser. No. 204,796, Nov. 7, 1980, Pat. No. 4,330,613.

[51] Int. Cl.$^3$ ................................................. G03C 5/04
[52] U.S. Cl. ..................................... 430/331; 430/110; 430/291; 430/965
[58] Field of Search ................ 430/110, 291, 331, 965

[56] References Cited

U.S. PATENT DOCUMENTS

| | | | |
|---|---|---|---|
| 3,458,804 | 7/1969 | Wolf et al. | 106/308 |
| 3,620,726 | 11/1971 | Chu et al. | 96/27 R |
| 3,677,756 | 7/1972 | Jones et al. | 96/48 |
| 3,909,282 | 9/1975 | Gray | 106/288 |
| 4,069,791 | 1/1978 | Tobias | 118/120 |
| 4,198,477 | 4/1980 | Williams et al. | 430/110 |
| 4,215,193 | 7/1980 | Manger et al. | 430/291 |

Primary Examiner—Jack P. Brammer

[57] ABSTRACT

Dry nonelectroscopic toners comprising pigmented organic resin particles having a size distribution of 0.2 to 30 micrometers, not more than 50 percent of the particles being less than 1 micrometer surface treated with a combination of at least 1% by weight of an antistatic agent and at least 0.5% of a slip agent as described. The preparation of the toners is described. The toners are useful in color developing positive and negative-working photosensitive elements particularly in an automatic toning machine. Improved clean-up and low stain propensity are achieved.

15 Claims, No Drawings

DRY NONELECTROSCOPIC TONERS FOR TONING TACKY IMAGE SURFACES

This is a division, of application Ser. No. 204,796 filed Nov. 7, 1980, now U.S. Pat. No. 4,330,613.

DESCRIPTION

1. Technical Field

This invention relates to dry nonelectroscopic toners. More particularly this invention relates to dry nonelectroscopic toners comprising pigmented organic resin particles surface treated with an antistatic agent and a slip agent. This invention also relates to the toning process using the toners.

2. Background Art

Reproduction processes are known wherein positive-working photopolymerizable elements and negative-working photosensitive elements are exposed imagewise through an original forming nontacky and tacky image areas. Positive-working photopolymerizable elements are described in Chu and Cohen U.S. Pat. No. 3,649,268 and negative-working photosensitive elements are described in Cohen and Fan U.S. Pat. Nos. 4,174,216 and 4,191,572. The image is developed by toning with a suitable toner which desirably adheres only in the tacky image areas. Excess toner which may be present is removed from the nontacky image areas to provide, for example, an image which is a proof of the original or which can be used to transfer the image to another surface. Multilayer proofs such as surprint proofs can be made as well.

In view of the increasing importance of proof-making in the printing industry and the problems inherent therein, improved toners and applicators for applying these toners are desirable. Some recognized improvements in toners are those described in Chu and Manger U.S. Pat. No. 3,620,726, mixtures using these toners described in Gray U.S. Pat. No. 3,909,282 and the toners of Manger, Fickes and Long described in U.S. Pat. No. 4,215,193. From the early use of pads dipped in toners, improved toner applicators are the subject of Sandner U.S. Pat. No. 4,019,821 (hand operated toning) and Tobias U.S. Pat. No. 4,069,791 (automatic toning). Application of any of the above described toners as well as known prior art toners to tacky image areas of photosensitive elements has the problem that the toners are difficult to completely remove from the nontacky image areas of the said elements. Generally the excess toner is removed from the nontacky areas by means of mechanical action using a cloth, brush or other toner removal means. It is known that static is generated by rubbing dissimilar materials together. Depending on the particular film being toned and the toner removal means, the amount of static formed varies. For example, cleaning brushes closest to the film in the triboelectric table would be expected to generate a relatively low charge. Thus it would be expected that an acrylic brush would generate only a small charge with respect to an element that contains an acrylic compound in its photosensitive layer. The toner, however, can also generate a charge against the brush (or cleaning means) and the photosensitive element. If the toner, cleaning means and element have an identical place in the triboelectric table substantially no static charge would be generated. Such a system, while desirable, is not generally achieved. Despite the aforementioned disadvantage the cleaning of nontacky areas is desirable. In manual applications this is time consuming. Cleaning operation in a machine increases the cost thereof. After clean-up, some undesirable stain is usually present.

To overcome the above disadvantages it is desired to provide dry, nonelectroscopic toner particles which, when applied to imagewise exposed elements containing tacky and nontacky image aeas, can be easily removed from the nontacky areas, e.g., without elaborate clean-up components in automatic toning machines. A further object is to provide such toners which substantially are nonstaining with respect to the nontacky areas.

DISCLOSURE OF THE INVENTION

In accordance with this invention there is provided a dry nonelectroscopic toner comprising pigmented organic resin particles having a size distribution within the range of 0.2 to 30 micrometers and not more than 50 percent of the particles being less than 1 micrometer particle size, the improvement whereby the pigmented particles are surface treated with at least 1% by weight of an antistatic agent in combination with at least 0.5% by weight of slip agent selected from the class consisting of silicone oil having a weight average molecular weight of about 230 to 50,000; saturated hydrocarbons having a weight average molecular weight of about 200 to 10,000; and fluorocarbon compounds having a weight average molecular weight of 500 to 500,000.

While not being limited to the following discussion, it is believed that the presence of an antistatic agent and a slip agent on the toner surface act in concert to prevent the toner particles from adhering to nontacky areas. The antistatic agent prevents an electrostatic charge from either accumulating or being maintained so that electrostatic attraction between the toners and nontacky areas are minimized or substantially eliminated. Simultaneously, working in conjunction with the antistatic agent, a slip agent prevents the toner particles from adhering to the nontacky areas by minimizing or preventing frictional forces or embedding of the particles. The slip agent favors the "skidding" of the toner particles over the nontacky surface and facilitates their removal while mechanical action, e.g., rubbing, is applied to the toners to embed them in the tacky image areas. In effect, the two additives working in cooperation substantially improve the differentiation of particles between the tacky and nontacky areas of the photosensitive element. The toners thus adhere to the tacky image areas but do not adhere to the nontacky areas.

The improved dry toners of this invention are nonelectroscopic toners comprising pigmented nonelectroscopic toners comprising pigmented organic resin particles having a size distribution within the range disclosed above. Nonelectroscopic means that the toners are neither repelled from nor attracted to a charged rod when placed in close proximity to the particles. The lower propensity of the toners to stain nontacky areas and the ease with which the toners can be removed from such areas is largely attributed to the presence on the surface of the toner particles of the combination of at least 1% by weight of an antistatic agent and at least 0.5% by weight of a slip agent, both of which are more fully described below.

The pigmented organic resin particles are described in Chu and Manger U.S. Pat. No. 3,620,726. Resin matrices include, e.g., polyvinyl chloride, cellulose acetate, cellulose acetate butyrate, polystyrene, polymethyl methacrylate. Also useful are water soluble polymer matrices, e.g., polyvinyl alcohol, methyl cellulose, carboxymethyl cellulose, the particular matrix being used depending on the mechanical means of processing the toner down to the desired effective particle size distribution. For the purpose of determining whether such a particle has the preferred particle size distribution these particles can be measured, for example, by a Coulter Counter, Coulter Electronics, Inc., Hialeah, Fla. The term "particle size" as used herein with respect to the toners covers the size distribution of the smallest, independently acting unit which is called upon to discriminate between the exposed and unexposed areas of the imaging element. The pigmented portion of the toners, in addition to the pigments illustrated in the examples include: Monastral® Blue G (C.I. Pigment Blue 15), Molybdate Orange (C.I. Pigment Red 104), Toluidine Red YW (C.I. Pigment Red 3)-process aggregated crystals, Phthalo Blue (C.I. Pigment Blue 15)-cellulose acetate dispersion, Toluidine Red (C.I. Pigment Red 3), Watchung Red BW (C.I. Pigment Red 48), Toluidine Yellow GW (C.I. Pigment Yellow 1), Monastral Blue BW (C.I. Pigment Blue 15), Monastral Green BW (C.I. Pigment Green 7), Pigment Scarlet (C.I. Pigment Red 60), Auric Brown (C.I. Pigment Brown 6), Monastral Green G (Pigment Green 7) and Monastral Maroon B and Monastral Orange, both of which last pigments are sold by the manufacturer under product nos. RT-849-D and YT-756-D, respectively.

Various types of known antistatic agents are useful for treating and coating the particulate toner surface. Useful antistatic agents include anionic, cationic, amphoteric and nonionic antistatic agents. Suitable antistatic agents, designated by class type, are as follows:

Anionic

1. Sodium alkyl benzene sulfonate wherein alkyl is an alkyl chain with 8 to 18 carbon atoms;

2. Sodium alkyl sulfonate wherein alkyl is an alkyl chain with 10 to 20 carbon atoms;

3. Secondary alkyl sulfate wherein one or both alkyl groups are substituted with functional groups taken from the group consisting of ester, ether, and alcohol, the alkyl being an alkyl chain of 1 to 18 carbon atoms;

4. Phosphorous-containing compounds of the formula $(RO)_mP(O(OX)_n$ wherein R is an alkyl chain with 4 to 18 carbon atoms, X is an cation taken from the group consisting of H, K, Na, NH$_4$, m is 1 or 2 and n is 2 or 1; and 5. Amine salt of alkyl sulfate wherein alkyl is an alkyl chain of 8 to 18 carbon atoms and amine is taken from the group consisting of ammonia, diethanolamine, triethanolamine and diethylcyclohexyl amine.

Cationic

6. Alkyl trimethyl ammonium bromide wherein alkyl is an alkyl chain with 1 to 18 carbon atoms; and 7., 13. Quaternary ammonium compounds of the formula:

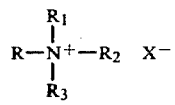

wherein R and R$_1$ may be a saturated or unsaturated alkyl chain with 1 to 24 carbon atoms or mixtures thereof, R$_2$ may be an alkyl chain of 1 to 24 carbon atoms or R$_3$ wherein R$_3$ is a polyether substituent of the formula $-(CH_2CH_2O)_m-[CH_2CH(CH_3)O]_n-H$ wherein m and n may be 0 to 20, the total of m and n being at least 1, and X is an anion taken from the group consisting of CH$_3$SO$_4$, C$_2$H$_5$SO$_4$, (CH$_3$)$_2$PO$_4$ (C$_2$H$_5$)$_2$PO$_4$; the total number of carbon atoms in R,R$_1$ and R$_2$ should not exceed 38.

Amphoteric

8. Alkyl bis(polyethanoxy)-gamma-sulfopropyl betaine and alkyl bis(hydroxyethy)-gamma-sulfopropyl betaine wherein alkyl is an alkyl chain with 12 to 24 carbon atoms, and in the former the number of polyether units is 1 to 4.

Nonionic 9, 10, 14, 15. Compounds of the formula: $R(OCH_2CH_2)_n-OH$ wherein R is a saturated and unsaturated alkyl chain with 12 to 18 carbon atoms or $CH_3(CH_2)_7-CH=CH(CH_2)_8-$, and n is 2 to 10; (Compound 9 is preferred)

11. Compounds of the formula: $R(OCH_2CH_2)_m[OCH_2CH(CH_3)]_n-OH$ wherein R is an alkyl chain with 12 to 18 carbon atoms, m is 0 to 10 and n is 1 to 10.

12. Mono and diglycerides of carboxylic acids having an alkyl chain of 12 to 18 carbon atoms.

The specific antistatic agents used in the examples are set forth below by number which corresponds to the particular definition of the antistatic agents set forth above.

1. Sodium dodecyl benzene sulfonate,

2. Sodium alkyl sulfonate wherein the average number of carbon atoms in the alkyl chain is 18 (C14 to C22), 3. Sodium salt of acetyloleoyl sulfate, 4. Mono- and bis-alkyl phosphate wherein the alkyl is derived from a mixture of C$_8$, C$_{10}$ and C$_{12}$ straight carbon atom chains, 5. Amine salt of lauryl sulfate, 6. Alkyl trimethyl ammonium bromide wherein alkyl chain is derived from cetyl and lauryl, 7. Quaternary ammonium compound of the formula:

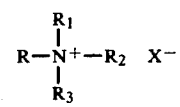

wherein R is a mixture of cetyl (27%), stearyl (30%) and oleoyl (42%) alkyl chains, R$_1$ is methyl, R$_2$ and R$_3$ are polyether substituents of the formula: $-(CH_2CH_2O)_m-[CH_2CH(CH_3)O]_n-H$ wherein m is 1 and n is 3, and X is an anion CH$_3$SO$_4$, 8. Alkyl bis(hydroxyethyl)-gamma-sulfopropyl betaine wherein the alkyl chain is of 16 to 18 carbon atoms (C$_{16}$ to C$_{18}$), 9. Compound of the formula: $R(OCH_2CH_2)_n-OH$ wherein R is an alkyl chain with 12 carbon atoms and n is 4, 10. Compound of the formula: $R(OCH_2CH_2)_n-OH$ wherein R is an alkyl chain derived from about 50% lauryl (C$_{12}$) and cetyl (C$_{16}$), 11. Compound of the formula:

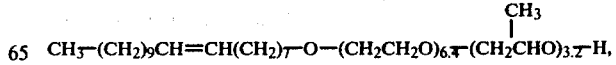

12. Mono and diglycerides of carboxylic acids having an alkyl chain derived from oleates, 13. Quaternary ammonium compound of the formula:

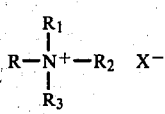

wherein R is a mixture of saturated and unsaturated $C_{16}$ to $C_{18}$ carbon atoms, $R_1$ is methyl, $R_2$ and $R_3$ are each $-(CH_2CH_2O)_m-H$, m is 8 and X is an anion $CH_3SO_4$, 14. Compound of the formula: $R-(OCH_2CH_2)_{8.4}-OH$ wherein R is a mixture of $C_{12}$, $C_{14}$ and $C_{16}$ alkyls, 15. Compounds of the formula: $R-(OCH_2CH_2)_{9.9}-OH$ wherein R is a mixture of saturated and unsaturated $C_{16}$ to $C_{18}$ carbon atoms.

Slip agents which are useful for treating and coating the particulate toner surface in cooperation with the above described antistatic agents are selected from the group consisting of silicone oil having a weight average molecular weight of about 230 to 50,000; saturated hydrocarbons having a weight average molecular weight of about 200 to 10,000; and fluorocarbon compounds having a weight average molecular weight of 500 to 500,000.

Silicone oils useful in the invention include: polydimethylsiloxane (1) and polymethyl (X) siloxane wherein X is an alkyl chain with 2 to 12 carbon atoms, eg., ethyl to dodecyl.

Saturated hydrocarbons include: motor lubricating oil, SAE 10, (3) paraffin oil viscosity at 55° C. is 70 cps using a Brookfield Viscometer manufactured by Brookfield Engineering Lab, Inc., Stoughton, MA; paraffin wax ranging in chain length from 20 to 34 carbon atoms; and polyethylene waxes having a molecular weight in the range of 1500 to 10,000.

Fluorinated hydrocarbons include: fluorocarbon oil (2), e.g., a polymer of $(CF_2CFCl)_x$ wherein X is 6 to 10, average molecular weight 965, viscosity at 38° C. is 2740 cp, viscosity at 71° C. is 160 cp; pour point is 21° C., (Fluorolube ® Hooker Chemical Co., Niagara Falls, N.Y.), and polytetrafluoroethylene compound (4) from the formula $[CF_2-CF_2]_x$ wherein X is a number of 6 to 10.

The above number designations appear in Example 6.

Silicone oil is the preferred slip agent. The slip agent when a liquid at normal room temperature is a nonsolvent for the toner, is nonvolatile, and is stable to aerial oxidation.

The antistatic agent is present on the surface of the particulate toner in amounts of at least 1% by weight up to about 12% by weight. A preferred range for antistatic agent is 5 to 10% by weight. The slip agent is present on said toner surface in an amount of at least 0.5% by weight up to about 12% by weight. A preferred range for the slip agent is 3 to 7% by weight. The above preferred ranges have been found particularly effective when applied to tacky image areas using a modified automatic toning apparatus (Tobias U.S. Pat. No. 4,069,791) as described in the examples below. U.S. Pat. No. 4,069,791 is incorporated herein by reference. If the amount of antistatic and slip agents exceed the maximum amounts good clean-up is achieved in nontacky image areas but another problem occurs. It has been found that pick-off of the toner in the toned image areas occurs. Pick-off is defined as low adhesion of a toner to tacky areas such that when a photoimagable element is applied over the toned image it does not adhere well to the previously toned image area (so that when the cover sheet of the element is removed areas of the layer above the toned area come off with the cover sheet, taking with it some of the applied toner).

The toner particles can be readily made as illustrated in the examples. The antistatic agent and slip agent can be added in either order or simultaneously to the pigmented resin particles. This is generally accomplished in a Patterson Kelley Twin Shell Blender manufactured by Patterson Kelley Co., Division of Harsco Corp., East Stroudsburg, Pa. or a Red Devil #30, 5400 Paint Conditioner Model MKI-R, Red Devil, Inc., Union, N.J. Other comparable milling devices can be used. The milling is for at least 5 minutes up to 30 minutes or longer. After milling the particles are permitted to dry or can be dried as is known to those skilled in the art.

The static charge on the surface-treated toners of the invention can be determined by a test procedure as follows:

50 grams of prepared toner are placed in toner jars and let stand overnight in a room at low relative humidity (219). Twelve ¼ inch steel balls are then placed in each jar, and the toners are thoroughly mixed by hand shaking for 60 seconds. After shaking the tops are removed and the voltage is recorded by inserting Sweeney Static Meter No. 1127 (contains radioactive material) dated 2/74, B. K. Sweeney Manufacturing Co., Denver, Colo. The results achieved with specified silicone-treated cyan toners and Controls C1 and C2 are set forth in Table 1 wherein the percentages are by weight.

TABLE 1

| Sample | Toner | Antistatic agent; Amt (%) | Lubricant (%)[3] | Voltage |
|---|---|---|---|---|
| 1 | C1[1] | None; 0 | 0 | −5,000 |
| 2 | C2[1] | None; 0 | 4.0 | −7,500 |
| 3 | C2 | 10; 6.5 | 4.0 | −1,250[2] |
| 4 | C2 | 10; 6.5 | 4.0 | −1,250[2] |
| 5 | C1 | 9; 7.0 | 2.0 | 0 |
| 6 | C1 | 10; 2.0 | 2.0 | −700[2] |
| 7 | C1 | 9; 2.0 | 2.0 | −1,100[2] |

[1]Controls, see Example 1 for preparation
[2]Voltages reduced to zero after one minute for Samples 3, 4, 6 and 7
[3]Lubricant is silicone oil The toners are useful for color development of a surface having imagewise tacky and nontacky areas wherein to the image-bearing surface is applied the nonelectroscopic toners described above, and the toner particles are distributed over the image surface whereby the toner particles become embedded solely in the tacky image areas. The remaining toner particles are physically removed, e.g., by wiping with a suitable cloth or clean-up section of a toning apparatus if one is used. The nontacky areas are left substantially free of the toner particles. The tacky surface is present in (a) a photopolymerizable layer (positive-working wherein the exposed areas become photohardened) (Chu et al. U.S. Pat. No. 3,649,268); (b) in an imagewise exposed photosensitive layer comprising at least one thermoplastic binder and a photosensitive system, consisting essentially of I. at least one dihydropyridine compound of the formula

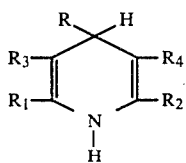

wherein

R is alkyl, alkenyl of 3 to 11 carbon atoms, phenylalkyl, phenylalkenyl, unsubstituted aryl of 6 to 10 carbon atoms, and heteroaryl, $R_1$ and $R_2$, which can be the same or different, are alkyl, and $R_3$ and $R_4$, which can be the same or different, are COOR', COR', CN, R' is alkyl; and II. at least one hexaarylbiimidazole compound, (negative-working wherein the exposed area are tacky) (Abele et al. U.S. Ser. No. 971,664, filed Dec. 21, 1978 now U.S. Pat. No. 4,243,741), or (c) in an imagewise exposed element containing nontonable image areas and tacky nonphotosensitive image areas (also negative-working element) (Cohen and Fan U.S. Pat. No. 4,174,216). These patents are incorporated by reference. Other systems known to those skilled in the art can be used provided that tacky and nontacky image areas are formed thereby. The tacky and nontacky image areas in these systems can be formed either directly, e.g., by exposure to actinic radiation or by treatment with solutions, heat or other means to obtain tacky image areas.

The above toned elements can be used to form surprint multicolor proofs by laminating at least one other tonable photoimagable layer over the previously imagewise toned layer as shown in FIG. 5 below. Each tonable layer is exposed through a different color separation transparency, and the respective layer is colored or developed with toners in a spectral region corresponding to the color separation transparency used for exposure. In most cases four photoimaged toned elements are present in a surprint proof, the toned elements and separation transparencies corresponding respectively to yellow, magenta, cyan and black.

A particularly preferred process involves automatic color development of a surface having imagewise tacky and nontacky areas by dispensing and embedding dry particulate toners on the surface by means of an automatic toning apparatus having a dispenser for dispensing said toner above said surface, and an applicator for embedding said particulate toners in said surface, and means for moving the tacky surface past the dispenser and said applicator, the dispenser includes a hopper having an independently movable side wall, and means to oscillate the side wall laterally of the tacky surface, thereby to supply the particulate material to the surface at a uniform, controlled rate, the improvement wherein the new dry, nonelectroscopic toners described above are automatically dispensed, embedded, and the excess removed (from the nontacky areas).

The toned elements particularly useful in conjunction with the automatic toning apparatus comprise:

1. A supported photopolymer layer having tacky and nontacky areas, solely the tacky image areas being toned with the toners of the invention, and 2. A photopolymer element comprising in order from top to bottom a layer comprising a nontacky photohardenable material with ethylenically unsaturated or benzophenone type groups, a contiguous layer of a nonphotosensitive tacky organic material toned imagewise with the toners of the invention, and a support.

BEST MODE FOR CARRYING OUT THE INVENTION

The best mode for the various types of toners is illustrated in the following examples:
Cyan toner, Example 1, sample 3, for positive-working photopolymerizable elements,
Cyan toner, Examples 1, sample 4, for negative-working photosensitive elements,
Yellow toner, Example 2, samples 11 and 14, for positive-working photopolymerizable elements,
Yellow toner, Example 2, samples 2 and 10, for negative-working photosensitive elements,
Black toner, Example 3, sample 13, for positive-working photopolymerizable elements,
Black toner, Example 3, samples 15 and 17, for negative-working sensitive elements,
Magenta toner, Example 4, samples 1, 10, and 17, for positive-working photopolymerizable elements,
Magenta toner, Example 4, samples 2, 10, 18 and 19, for negative-working photosensitive elements.

INDUSTRIAL APPLICABILITY

The dry nonelectroscopic toners are useful for application to positive or negative-working tacky photosensitive surfaces which are used to prepare color proofs, e.g., overlays and surprints. The toners are particularly useful in the toning of such elements in conjunction with toning apparatus, e.g., an automatic toning apparatus described in Tobias U.S. Pat. No. 4,069,791, without the need for a cleanup section. The toners are easily prepared and are less susceptible to static charge buildup than other known nonelectroscopic toners. The toned elements exhibit good toning and are substantially stain free in the nontacky areas. The clean-up of excess toner is particularly advantageous.

EXAMPLES

The following examples illustrate the invention wherein the parts and percentages are by weight. The antistatic and slip agents set forth in the Tables are designated as set forth above. In the Tables below a plus or minus after the sample number indicates a positive-working and negative-working photosensitive element, respectively.

EXAMPLE 1

The following ingredients are used in the preparation of cyan toners:

| Ingredient | Amount (g) |
| --- | --- |
| Monastral Blue G (Copper Phthalocyanine, Pigment Blue 15 C.I. No. 74160) | 1728.0 |
| Cellulose Acetate | 7871.0 |
| Acetone | 27,669.6 |
| Water | 22,680.0 |

The water and acetone are thoroughly mixed and are charged to a Type 30-S Attritor stirred ball mill (Union Process Co., Akron, Ohio). This mill contains ⅛ inch (0.049 cm) Type 440 stainless steel balls that are agitated at 150 rpm. A nitrogen atmosphere is maintained in the mill during the mixing procedure. Approximately two-third of the weight of the cellulose acetate is then added during a 3 to 5 minute period and is agitated in the liquid for about 2 minutes. The pigment is then added over a 2 minute period followed by the remainder of the cellulose acetate. The mixture is then agitated at about 150 rpm in the mill for about 6 hours; the mill is drained and washed with water; and the combined effluents are filtered to collect the wet toner. The wet toner is water-washed and dried in an oven at 115°–125° C., and the dried toner is pulverized in a hammer mill in combination with dry ice to keep the pulverized toner flowing through the screens of the hammer mill. The particle size distribution of the toner at this point is 0.2 to 30 micrometers with not more than 50% of the particles less than 1 micron equivalent spherical diameter.

A portion of the resultant toner is then surface treated by blending with dimethylpolysiloxane, 400 g/10 kg of toner (200-Fluid CS, Dow Corning Co., Midland, Mich.) in a Patterson-Kelley Twin-Shell blender.

The untreated toner (without silicone treatment) designated C1, is bleached for about 30 minutes with various amounts of the antistatic agents and silicone compound as set forth in Table 2 below. The toner surface treated with silicone, designated C2, is further blended for about 30 minutes with various amounts of the antistatic agents also as set forth in Table 2. The blending is accomplished in a Red Devil (#30,5400 Paint Conditioner Model MK1-R maufactured by Red Devil, Inc., Union, NJ.

A positive-working photopolymerizable element similar to that described in Example 1, U.S. Pat. No. 3,649,268 is prepared having a 0.0003 inch (0.00076 cm) photopolymer layer coated on 0.0005 inch (0.0013 cm) polyethylene terephthalate film support, and covered by a suitable 0.00075 inch (0.0019 cm) polypropylene cover sheet. As described in Example 1 of U.S. Pat. No. 3,649,268, the cover sheet is removed and the photopolymer layer is laminated to Kromekote paper (on cast coated side). A suitable solid test pattern image is exposed on the photopolymer whereby the exposed areas become hardened and the unexposed areas remain tacky. The polyethylene terephthalate film is then removed and the image is developed by toning using the toning apparatus described in Tobias U.S. Pat. No. 4,069,791 wherein the hopper has a laterally oscillating sidewall and the cleaning pad is eliminated. Results are shown in the Table 2 below wherein + means that a positive-working element has been utilized.

A negative-working photosensitive element is prepared by laminating in surface-to-surface relationship at room temperature with a pressure of about 40 psi (2.81 kg/dm²) a supported photopolymerizable layer (I) and supported tonable, tacky elastomer contiguous layer (II). Layers I and II are prepared as follows:

I. Nontonable Photopolymerizable Layer

A coating solution of a photopolymerizable composition is prepared by mixing together the following ingredients:

| Ingredient | Weight (g) |
|---|---|
| Polymethyl methacrylate (MW 200,000–300,000) | 41.54 |
| Di-(3-acryloxy-2-hydroxypropyl) ether of Bisphenol-A | 51.86 |
| (2-Chlorophenyl-4,5-diphenyl imidazolyl) dimer | 2.20 |
| 2-(Stilbyl-4")-(naptho-1',2';4,5) 1,2,3-triazol-2"-sulfonic acid phenyl ester | 2.20 |
| 2-Mercaptobenzoxazole | 1.50 |
| Polyethylene oxide (MW 600,000) | 0.70 |
| Methanol | 20.70 |
| Methylene chloride | 323.70 |

This solution is coated at a coating weight of about 40 mg/dm² when dried on a clear polyethylene terephthalate film having a thickness of 0.0005 inch (0.0015 cm) which is surface treated by electrostatic discharge at 0.07 coulombs/ft² (0.093 coulombs/m²).

II. Tonable, Tacky Elastomer Contiguous Layer

A coating solution is prepared by mixing together the following ingredients:

| Ingredient | Weight (g) |
|---|---|
| Random copolymer of styrene/butadiene (40/60) | 19.75 |
| Cis-polybutadiene (Mooney Viscosity 55–60) | 79.75 |
| Tetra-bis-[methylene 3-(3',5'-di-t-butyl-4'-hydroxyphenyl) proprionate] methane | 0.50 |
| Methylene chloride to make | 1333.30 |

This solution is coated on polyethylene terephthalate film having a releasable layer of polydimethyl siloxane coat d thereon to give a coating weight of about 125 mg/dm² when dried.

The negative-working element is exposed through the electrostatic discharge treated, clear polyethylene terephthalate film for about 30 seconds on a Berkey-Ascor Vacuum Printer exposure device, fitted with a photopolymer lamp (2 KW) and a Kokomo ® glass filter (No. 400) Kokomo Opalescent Glass Co., Kokomo, IN. The distance between the lamp and the vaccum frame of the device is about 38 inches (96.52 cm). After exposure, the exposed element is taped securely to a suitable flat surface, and the clear polyethylene terephthalate cover sheet is stripped by pulling at one corner with an even, continuous motion at an angle of about 135°–180°. The resulting exposed, photopolymerized image adheres to the treated polyethylene terephthalate film and is removed therewith exposing equivalent areas of the contiguous layer (II). The tacky image is developed by toning using the toning apparatus described above. Results are shown in Table 2 below wherein means that a negative-working element has been utilized.

TABLE 2

| Sample | Toner | Antistatic Agent | Amount of Antistatic Agent (%) | Amount of Silicone (%) | Clean-up | Stain-Free | Toning Quality |
|---|---|---|---|---|---|---|---|
| 1 + | C1 | 10 | 7.5 | 0 | Excellent | Poor | Poor |
| 2 + | C2 | None | 0 | 4.0 | Poor | Good | Good |
| 3 ± | C1 | 10 | 7.5 | 2.0 | Excellent | Good | Good |
| 4 ± | C2 | 10 | 7.5 | 4.0 | Excellent | Good | Good |
| 5 ± | C1 | 10 | 7.5 | 1.0 | Excellent | Good | Good |
| 6 ± | C1 | 9 | 7.0 | 2.0 | Good | Good | Good |

TABLE 2-continued

| Sample | Toner | Antistatic Agent | Amount of Antistatic Agent (%) | Amount of Silicone (%) | Clean-up | Stain-Free | Toning Quality |
|---|---|---|---|---|---|---|---|
| 7 ± | C1 | 7 | 6.0 | 4.0 | Good | Good | Good |
| 8 ± | C1 | 13 | 7.5 | 4.0 | Good | Good | Good |
| 9 ± | C1 | 11 | 6.0 | 4.0 | Excellent | Good | Good |
| 10 ± | C1 | 7 and 10 | 6.0 and 6.0 | 4.0 | Good | Good | Good |
| 11 ± | C1 | 14 | 6.0 | 4.0 | Good | Good | Good |
| 12 ± 1 | C1 | 10 | 1.5 | 1.5 | Good | Good | Good |

1 The tacky image areas are developed by hand toning using the toning applicator as described in Sandner, U.S. 4,019,821.

EXAMPLE 2

The following ingredients are used to prepare yellow toners:

| Ingredient | Amount (g) |
|---|---|
| Dalamar yellow (Pigment Yellow 74, C.I. No. 11741) | 4,360.0 |
| Cellulose acetate | 6,538.0 |
| Acetone | 27,669.6 |
| Water | 22,680.6 |
| Dimethylpolysiloxane described in Example 1 | 1,150.0[1] |

[1]Based on 10 kg of toner

The toner is prepared as described in Example 1 except that the milling time is 4 hours. The toner is dried and pulverized (designated Y1). A portion of Y1 toner is surface treated with dimethylpolysiloxane as described in Example 1 (designated Y2). The two toners are mixed with varying amounts of the antistatic agents set forth in Table 3 below. In some samples additional silicone is mixed with the toners. Positive and negative-working elements as described in Example 1 are developed using the toning apparatus described in Example 1 except for Samples 15 and 16 as noted.

EXAMPLE 3

The following ingredients are used to prepare black toners:

| Ingredient | Amount (g) |
|---|---|
| Carbon Black, Sterling NS N 774 (Pigment Black 7, C.I. No. 77266) | 6,300.0 |
| Cellulose acetate | 6,300.0 |
| Acetone | 27,669.6 |
| Water | 22,680.0 |
| Dimethylpolysiloxane described in Example 1 | 970.0[1] |

[1]Based on 12.6 kg of toner

The toner is prepared in the same manner as described in Example 1.

The dry toner is pulverized (designated B1). A portion of B1 toner is surface treated with dimethylpolysiloxane as described in Example 1 (designated B2). The two toners are mixed with varying amounts of the antistatic agents set forth in Table 4 below. In some samples additional silicone is mixed with the toners. Positive and negative-working elements as described in Example 1 are developed using the toning apparatus described in Example 1 except for Sample 16 as noted.

TABLE 3

| Sample | Toner | Antistatic Agent | Amount of Antistatic Agent (%) | Amount of Silicone (%) | Clean-up | Stain-Free | Toning Quality |
|---|---|---|---|---|---|---|---|
| 1 ± | Y1 | 10 | 5.0 | 10.0 | Good | Good | Good |
| 2 ± | Y1 | 10 | 10.0 | 10.0 | Good | Good | Good |
| 3 ± | Y1 | 7 and 10 | 4.0 and 4.0 | 10.0 | Good | Good | Good |
| 4 ± | Y2 | 7 | 7.5 | 10.0 | Good | Good | Good |
| 5 ± | Y2 | 11 | 6.0 | 10.0 | Excellent | Good | Excellent |
| 6 ± | Y2 | 12 | 5.0 | 10.0 | Fair | Good | Good |
| 7 ± | Y2 | 7 | 6.0 | 10.0 | Good | Good | Good |
| 8 ± | Y2 | 14 | 6.0 | 10.0 | Good | Good | Good |
| 9 ± | Y2 | 10 | 7.5 | 10.0 | Good | Good | Good |
| 10 ± | Y2 | 10 | 9.8 | 10.0 | Good | Good | Good |
| 11 ± | Y1 | 10 | 9.8 | 5.0 | Good | Good | Good |
| 12[a] ± | Y1 | 10 | 10.0 | 0 | Good | Poor | Good |
| 13[a] ± | Y1 | 9 | 10.0 | 0 | Good | Poor | Good |
| 14 ± | Y1 | 10 | 7.5 | 5.0 | Good | Good | Good |
| 15[b] ± | Y1 | 10 | 4.0 | 6.0 | Good | Good | Good |
| 16[b] ± | Y1 | 10 | 4.0 | 8.0 | Good | Good | Good |
| 17 ± | Y1 | 9 | 9.5 | 5.0 | Good | Good | Good |
| 18[a] ± | Y2 | None | 0 | 10.0 | Poor | Good | Good |

[a]Controls
[b]Developed by hand toning as described in Table 2, Example 1

TABLE 4

| Sample | Toner | Antistatic Agent | Amount of Antistatic Agent (%) | Amount of Silicone (%) | Clean-up | Stain-Free | Toning Quality |
|---|---|---|---|---|---|---|---|
| 1 ± | B1 | 7 and 10 | 4.0 and 4.0 | 8.0 | Good | Good | Good |
| 2[a] ± | B2 | None | 0 | 8.0 | Poor | Good | Good |
| 3 ± | B2 | 7 | 6.0 | 8.0 | Good | Good | Good |

TABLE 4-continued

| Sample | Toner | Antistatic Agent | Amount of Antistatic Agent (%) | Amount of Silicone (%) | Clean-up | Stain-Free | Toning Quality |
|---|---|---|---|---|---|---|---|
| 4 ± | B2 | 12 | 6.0 | 8.0 | Good | Good | Good |
| 5 ± | B2 | 14 | 6.0 | 8.0 | Good | Good | Good |
| 6 ± | B2 | 10 | 6.0 | 8.0 | Good | Good | Good |
| 7 ± | B2 | 7 | 7.5 | 8.0 | Good | Good | Good |
| 8 ± | B2 | 10 | 7.5 | 8.0 | Good | Good | Good |
| 9$^a$ ± | B1 | 9 | 10.0 | 0 | Good | Moderate | Good |
| 10 ± | B2 | 10 | 9.5 | 8.0 | Good | Good | Good |
| 11$^a$ + | B2 | None | 0 | 10.0 | Poor | Good | Good |
| 12 + | B1 | 9 | 5.0 | 10.0 | Good | Good | Good |
| 13 + | B1 | 9 | 10.0 | 4.0 | Good | Good | Good |
| 14 + | B1 | 10 | 9.5 | 4.0 | Good | Good | Good |
| 15 − | B2 | 9 | 2.0 | 8.0 | Good | Good | Good |
| 16$^b$ − | B2 | 9 | 2.0 | 2.0 | Good | Good | Good |
| 17 − | B2 | 9 | 2.0 | 10.0 | Good | Good | Good |

$^a$Controls
$^b$Developed by hand toning as described in Table 2, Example 1

EXAMPLE 4

The following ingredients are used to prepare magenta toners.

| Ingredient | M₁ | M₂ | M₃ |
|---|---|---|---|
| Quindo Magenta (Pigment Red 122, Allied Chemical Corp., Harmon Colors) | 5,312.0 | 3,910.0 | 3,315.0 |
| Indo Brilliant Scarlet Toner (Pigment Red 123, C.I. No. 71145) | — | 730.0 | 1,560.0 |
| Cellulose acetate | 6,469.0 | 6,960.0 | 6,929.0 |
| Acetone | 22,669.6 | 27,669.6 | 27,669.6 |
| Water | 22,669.6 | 22,680.0 | 22,680.0 |
| Dimethylpolysiloxane | 679.0$^1$ | 679.0$^1$ | 679.0$^1$ |
| described in Example 1, | | | |

$^1$Based on 11.8 kg of toner

The toners are prepared in the same manner described in Example 1. After drying the toners are pulverized (designated M1, M2 and M3). A portion of each toner is surface treated with dimethylpolysiloxane as described in Example 1 (designated M4, M5 and M6). The toners are mixed with varying amounts of the antistatic agents as listed in Table 5 below. In some samples additional silicone is mixed with the toners. Positive and negative-working elements as described in Example 1 are developed using the toning apparatus described in Example 1 except for Samples 21 to 25 as noted.

TABLE 5

| Sample | Toner | Antistatic Agent | Amount of Antistatic Agent (%) | Amount of Silicone (%) | Clean-up | Stain-Free | Toning Quality |
|---|---|---|---|---|---|---|---|
| 1 ± | M2 | 10 | 10.0 | 4.0 | Good | Good | Good |
| 2 ± | M2 | 10 | 10.0 | 8.0 | Good | Good | Good |
| 3 ± | M1 | 10 and 7 | 5.0 and 5.0 | 6.0 | Good | Good | Good |
| 4 ± | M4 | 12 | 6.0 | 6.0 | Fair | Good | Good |
| 5$^a$ ± | M4 | None | 0 | 9.0 | Poor | Good | Good |
| 6$^a$ ± | M5 | None | 0 | 9.0 | Poor | Good | Good |
| 7$^a$ ± | M6 | None | 0 | 9.0 | Poor | Good | Good |
| 8 ± | M4 | 11 | 7.5 | 6.0 | Good | Good | Good |
| 9 ± | M4 | 10 | 7.5 | 6.0 | Good | Good | Good |
| 10 ± | M4 | 10 | 9.0 | 6.0 | Good | Good | Good |
| 11 ± | M4 | 7 | 9.0 | 6.0 | Good | Good | Good |
| 12 ± | M4 | 10 | 7.5 | 9.0 | Good | Good | Good |
| 13$^a$ ± | M1 | 10 | 10.0 | 0 | Good | Moderate | Good |
| 13$^a$ − | M1 | 10 | 10.0 | 0 | Good | Poor | Good |
| 14$^a$ + | M2 | 10 | 10.0 | 0 | Good | Moderate | Good |
| 14$^a$ − | M2 | 10 | 10.0 | 0 | Good | Poor | Good |
| 15 ± | M5 | 10 | 7.0 | 9.0 | Good | Good | Good |
| 16$^a$ + | M2 | 9 | 10.0 | 0 | Excellent | Poor | Good |
| 16$^a$ − | M2 | 9 | 10.0 | 0 | Fair | Poor | Good |
| 17 ± | M2 | 10 | 8.0 | 4.0 | Good | Good | Good |
| 18 ± | M2 | 10 | 8.0 | 8.0 | Good | Good | Good |
| 19 ± | M3 | 10 | 8.0 | 8.0 | Good | Good | Good |
| 20 ± | M3 | 10 | 8.0 | 4.0 | Good | Good | Good |
| 21$^b$ ± | M3 | 10 | 4.0 | 4.0 | Good | Good | Good |
| 22$^b$ ± | M3 | 10 | 4.0 | 6.0 | Good | Good | Good |
| 23$^b$ ± | M1 | 10 | 4.0 | 6.0 | Good | Good | Good |
| 24$^b$ ± | M1 | 10 | 3.0 | 3.0 | Good | Good | Good |
| 25$^b$ ± | M3 | 10 | 3.0 | 3.0 | Good | Good | Good |
| 26$^a$ ± | M3 | None | 0 | 6.4 | Poor | Good | Good |
| 27 + | M1 | 9 | 8.5 | 3.0 | Good | Good | Good |
| 28 ± | M2 (73%) and | 10 | 9.0 and 4.0 | 4.0 and 6.0 | Good | Good | Good |

TABLE 5-continued

| Sample | Toner | Antistatic Agent | Amount of Antistatic Agent (%) | Amount of Silicone (%) | Clean-up | Stain-Free | Toning Quality |
|---|---|---|---|---|---|---|---|
| | M5 (27%) | | | | | | |

<sup>a</sup>Control
<sup>b</sup>Developed by hand toning as described in Table 2, Example 1

EXAMPLE 5

A photopolymerizable composition is prepared by mixing together the following ingredients:

| Ingredient | Amount (parts) |
|---|---|
| Polymethylmethacrylate, molecular weight 30,000, density 1.13 g/cc | 32.40 |
| Trimethylolpropane trimethacrylate | 35.60 |
| 2-o-Chlorophenyl-4,5-bis-(m-methoxyphenyl) imidazolyl dimer | 1.58 |
| 2-Mercaptobenzothiazole | 0.79 |
| Polyoxyethylene lauryl ether | 7.90 |

The mixture is dissolved in methylene chloride (20% solution) and is coated onto a 0.001 inch (0.0025 cm) thick polyethylene terephthalate support and a 0.001 inch (0.0025 cm) thick cover sheet of polypropylene is laminated onto the coating at room temperature. The cover sheet is removed at room temperature with substantially no effect on the photopolymerizable layer, and the layer is laminated at about 110° C. to the smooth side of Kromekote ® cast-coated one-side paper, manufactured by Champion Paper and Fiber Company on a fixed-bed transfer machine as described in Chu et al. U.S. Pat. No. 3,594,535, incorporated by reference. The photopolymer layer is exposed at a distance of about 27 inches (68.6 cm) through a minus-blue separation halftone positive for about 8 seconds using a nuArc ® Plate Maker "Flip Top", Model FT26M-2 carbon arc light source. The polyethylene terephthalate support is removed at room temperature and yellow toner (Y1), prepared as described in Example 2 containing 10% antistatic agent, 10, and 5% silicone, is applied to the exposed photopolymer surface using the automatic toner apparatus described in Example 1, adapted for 4-toner application. The clean-up and toning quality are good and the stain-free quality is also good. The toner adheres only to those image areas that were not exposed to the radiation.

The cover sheet is removed from a second element coated with the above-described composition, and the clear photopolymer layer is laminated onto the yellow-toned layer, obtained above, at a temperature of 110° C. The two-layer element is exposed through a minus-green separation halftone positive for 3 seconds using the nuArc ® light source. The base support is stripped from the photopolymer, and a magenta toner (M1) prepared as described in Example 4 containing 10% antistatic agent, 10, and 4% silicone, is applied to the exposed photopolymer surface at room temperature using the automatic toning apparatus described above. The clean-up, toning quality and stain-free quality are good.

The cover sheet is removed from a third photopolymerizable element coated with the above-described composition and the clear photopolymer layer is laminated onto the magenta-toned layer, obtained above, at a temperature of 110° C. This is exposed through the minus-red halftone positive for 3 seconds using the nuArc ® light source. The polyethylene terephthalate support is removed from the layer, and a cyan toner (C1) prepared as described in Example 1 containing 8% antistatic agent, 10, and 2% silicone, is applied to the exposed photopolymer surface using the automatic toner apparatus described above. The clean-up, toning quality and stain-free quality are good.

A fourth photopolymerizable layer is laminated onto the cyan-toned layer of the three-layer film base using the same procedure and under the same conditions used in preparing the two previous layers. The fourth layer is exposed through a black printer halftone positive for 3 seconds using the nuArc light source. After stripping off the polyethylene terephthalate support, a black toner (B1) prepared as described in Example 3 containing 10% antistatic agent, 10, and 4% silicone, is applied to the exposed photopolymer surface using the automatic toner apparatus described above. The clean-up, toning quality and stain-free quality are good.

After application of the black toner, a fifth layer of photopolymer is laminated at 110° C. over the four-color halftone positive which simulates closely a press proof.

The above procedure was repeated except that the toners used were control toners containing silicone but no antistatic agent as follows:

Yellow toner (Y2), 10% silicone
Magenta toner (M4), 9% silicone
Cyan toner (C2), 4% silicone
Black toner (B2), 8% silicone The stain-free quality and toning quality are good but the clean-up quality of the exposed areas of the photopolymer layers is poor.

EXAMPLE 6

Positive-working photopolymerizable elements are prepared as described in Example 5 and are imagewise exposed as described in that example. A cyan toner (C1) is blended as described in Example 1 with the percentages of antistatic agent and slip agent as set forth in Table 6 below. The slip agents are designated by number as set forth above. The stain optical densities are measured on a Cary recording spectrophotometer.

TABLE 6

| Sample | Antistatic Agent | Amount of Antistatic Agent (%) | Slip Agent | Amount of Slip Agent (%) | Stain (O.D.) |
|---|---|---|---|---|---|
| 1 | None | 0 | None | 0 | 0.05 |
| 2 | 10 | 1.0 | None | 0 | 0.04 |
| 3 | None | 0 | 1 | 0.5 | 0.025 |
| 4 | 10 | 1.0 | 1 | 0.5 | 0.01 |
| 5 | None | 0 | 2 | 0.5 | 0.04 |
| 6 | None | 0 | 2 | 2.0 | 0.03 |
| 7 | 10 | 6.0 | 2 | 4.0 | 0.01 |
| 8 | 10 | 6.0 | 2 | 0.5 | 0.02 |
| 9 | None | 0 | 3 | 0.5 | 0.045 |
| 10 | None | 0 | 3 | 2.0 | 0.03 |
| 11 | 10 | 6.0 | 3 | 4.0 | 0.005 |
| 12 | 10 | 6.0 | 3 | 0.5 | 0.02 |
| 13 | None | 0 | 4 | 2.5 | 0.02 |
| 14 | 10 | 6.0 | None | 0 | 0.03 |

TABLE 6-continued

| Sample | Antistatic Agent | Amount of Antistatic Agent (%) | Slip Agent | Amount of Slip Agent (%) | Stain (O.D.) |
|---|---|---|---|---|---|
| 15 | 10 | 6.0 | 4 | 0.5 | 0.015 |

I claim:

1. A dry nonelectroscopic toner comprising pigmented organic resin particles having a size distribution within the range of 0.2 to 30 micrometers and not more than 50 percent of the particles being less than 1 micrometer particle size, the improvement whereby the pigmented particles are surface coated with at least 1% by weight of an antistatic agent in combination with at least 0.5% by weight of slip agent selected from the class consisting of silicone oil having a weight average molecular weight of about 230 to 50,000; saturated hydrocarbons having a weight average molecular weight of about 200 to 10,000; and fluorocarbon compounds having a weight average molecular weight of 500 to 500,000.

2. A toner according to claim 1 wherein the slip agent is polydimethylsiloxane or polymethyl(X)siloxane where X is an alkyl chain with 2 to 12 carbon atoms.

3. A toner according to claim 1 wherein the antistatic agent is an anionic antistatic agent.

4. A dry nonelectroscopic toner comprising pigmented organic resin particles having a size distribution within the range of 0.2 to 30 micrometers and not more than 50 percent of the particles being less than 1 micrometer particle size, the improvement whereby the pigmented particles are surface coated with at least 1% by weight of an anionic antistatic agent which is a member taken from the group consisting of:
   (a) sodium alkyl benzene sulfonate wherein alkyl is an alkyl chain with 8 to 18 carbon atoms;
   (b) sodium alkyl sulfonate wherein alkyl is an alkyl chain with 10 to 20 carbon atoms;
   (c) secondary alkyl sulfate wherein one or both alkyl groups are substituted with functional groups taken from the group consisting of ester, ether, and alcohol, the alkyl being an alkyl chain of 1 to 18 carbon atoms;
   (d) phosphorous-containing compound of the formula $(RO)_m P(O(OX)_n$ wherein R is an alkyl chain with 4 to 18 carbon atoms, X is an cation taken from the group consisting of H, K, Na, $NH_4$, m is 1 or 2 and n is 2 or 1; and
   (e) amine salt of alkyl sulfate wherein alkyl is an alkyl chain of 8 to 18 carbon atoms and amine is taken from the group consisting of ammonia, diethyanolamine, triethanolamine and diethylcyclohexyl amine in combination with at least 0.5% by weight of slip agent selected from the class consisting of silicone oil having a weight average molecular weight of about 230 to 50,000; saturated hydrocarbons having a weight average molecular weight of about 200 to 10,000; and fluorocarbon compounds having a weight average molecular weight of 500 to 500,000.

5. A toner according to claim 1 wherein the antistatic agent is a cationic antistatic agent.

6. A dry nonelectroscopic toner comprising pigmented organic resin particles having a size distribution within the range of 0.2 to 30 micrometers and not more than 50 percent of the particles being less than 1 micrometer particle size, the improvement whereby the pigmented particles are surface coated with at least 1% by weight of a cationic antistatic agent which is a member taken from the group consisting of
   (a) alkyl trimethyl ammonium bromide wherein alkyl is an alkyl chain with 1 to 18 carbon atoms; and
   (b) Quaternary ammonium compounds of the formula:

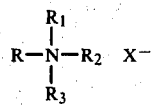

wherein R and $R_1$ may be a saturated or unsaturated alkyl chain with 1 to 24 carbon atoms or mixtures thereof, $R_2$ may be an alkyl chain of 1 to 24 carbon atoms or $R_3$ wherein $R_3$ is a polyether substituent of the formula $—(CH_2CH_2O)_m—[CH_2CH(CH_3)O]_n—H$ wherein m and n may be 0 to 20, the total of m and n being at least 1, and X is an anion taken from the group consisting of $CH_3SO_4$, $C_2H_5SO_4$, $(CH_3)_2PO_4$, $(C_2H_5)_2PO_4$; the total number of carbon atoms in $R, R_1$ and $R_2$ should not exceed 38 in combination with at least 0.5% by weight of slip agent selected from the class consisting of silicone oil having a weight average molecular weight of about 230 to 50,000; saturated hydrocarbons having a weight average molecular weight of about 200 to 10,000; and fluorocarbon compounds having a weight average molecular weight of 500 to 500,000.

7. A toner according to claim 1 wherein the antistatic agent is an amphoteric antistatic agent.

8. A dry nonelectroscopic toner comprising pigmented organic resin particles having a size distribution within the range of 0.2 to 30 micrometers and not more than 50 percent of the particles being less than 1 micrometer particle size, the improvement whereby the pigmented particles are surface coated with at least 1% by weight of an amphoteric antistatic agent which is taken from the class consisting of alkyl bis(polyethanoxy)-gamma-sulfopropyl betaine and alkyl bis(hydroxyethyl)-gamma-sulfopropyl betaine wherein alkyl is an alkyl chain with 12 to 24 carbon atoms and in the former the number of polyether units is 1 to 4 in combination with at least 0.5% by weight of slip agent selected from the class consisting of silicone oil having a weight average molecular weight of about 230 to 50,000; saturated hydrocarbons having a weight average molecular weight of about 230 to 50,000; saturated hydrocarbons having a weight average molecular weight of about 200 to 10,000; and fluorocarbon compounds having a weight average molecular weight of 500 to 500,000.

9. A toner according to claim 1 wherein the antistatic agent is a nonionic antistatic agent.

10. A dry nonelectroscopic toner comprising pigmented organic resin particles having a size distribution within the range of 0.2 to 30 micrometers and not more than 50 percent of the particles being less than 1 micrometer particle size, the improvement whereby the pigmented particles are surface coated with at least 1% by weight of a nonionic antistatic agent which is a member taken from the group consisting of a compound of the formula:
   (a) $R(OCH_2CH_2)_n—OH$ wherein R is a saturated or unsaturated alkyl chain with 12 to 18 carbon atoms or $CH_3(CH_2)_7—CH=CH(CH_2)_8—$, and n is 2 to 10;

(b) R(OCH$_2$CH$_2$)$_m$[OCH$_2$CH(CH$_3$)]$_n$—OH wherein R is an alkyl chain with 12 to 18 carbon atoms, m is 0 to 10 and n is 1 to 10; and (c) mono and diglycerides of carboxylic acids having an alkyl chain of 12 to 18 carbon atoms in combination with at least 0.5% by weight of slip agent selected from the class consisting of silicone oil having a weight average molecular weight of about 230 to 50,000; saturated hydrocarbons having a weight average molecular weight of about 200 to 10,000; and fluorocarbon compounds having a weight average molecular weight of 500 to 500,000.

11. A toner according to claim 1 wherein the pigmented resin particles are comprised of cellulose acetate particles having pigment particles embedded in their surfaces.

12. A process of preparing dry, nonelectroscopic surface coated toners from pigmented organic resin particles having a size distribution within the range of 0.2 to 30 micrometers and not more than 50 percent of the particles being less than 1 micrometer particle size which comprises adding in either order or simultaneously to the pigmented resin particles an antistatic agent and a slip agent selected from the class consisting of silicone oil having a weight average molecular weight of about 230 to 50,000; saturated hydrocarbons having a weight average molecular weight of about 200 to 10,000; and fluorocarbon compounds having a weight average molecular weight of about 500 to 500,000.

13. A process according to claim 12 wherein the antistatic agent is of the formula:

R(OCH$_2$CH$_2$)—OH wherein R is an alkyl chain with 12 to 18 carbon atoms or CH$_3$(CH$_2$)$_7$—CH=CH(CH$_2$)$_8$—, and n is 2 to 10.

14. A process according to claim 12 wherein the slip agent is polydimethylsiloxane or polymethyl(X)siloxane where X is an alkyl chain with 2 to 12 carbon atoms.

15. A process according to claim 12 wherein the pigmented resin particle are comprised of cellulose acetate particles having pigment particles embedded in their surfaces.

* * * * *

UNITED STATES PATENT AND TRADEMARK OFFICE
CERTIFICATE OF CORRECTION

PATENT NO. : 4,397,941
DATED : August 9, 1983
INVENTOR(S) : Michael Glenn Fickes It is certified that error appears in the above—identified patent and that said Letters Patent is hereby corrected as shown below:

| | |
|---|---|
| Column 7, line 35 | "FIG" should be --Example-- |
| Column 18, line 48 | after "50,000;" delete "satu-" |
| Column 18, line 49 | delete "rated hydrocarbons having a weight average molecular |
| Column 18, line 50 | delete "weight of about 230 to 50,000;" |

Signed and Sealed this

Fifteenth Day of January 1985

[SEAL]

Attest:

GERALD J. MOSSINGHOFF

Attesting Officer    Commissioner of Patents and Trademarks